United States Patent
Schricker et al.

(10) Patent No.: US 8,445,385 B2
(45) Date of Patent: May 21, 2013

(54) METHODS FOR ETCHING CARBON NANO-TUBE FILMS FOR USE IN NON-VOLATILE MEMORIES

(75) Inventors: April D. Schricker, Palo Alto, CA (US); Andy Fu, San Ramon, CA (US); Michael Konevecki, San Jose, CA (US); Steven Maxwell, Sunnyvale, CA (US)

(73) Assignee: SanDisk 3D LLC, Milpitas, CA (US)

( * ) Notice: Subject to any disclaimer, the term of this patent is extended or adjusted under 35 U.S.C. 154(b) by 176 days.

(21) Appl. No.: 12/421,803

(22) Filed: Apr. 10, 2009

(65) Prior Publication Data

US 2009/0278112 A1  Nov. 12, 2009

Related U.S. Application Data

(60) Provisional application No. 61/044,314, filed on Apr. 11, 2008, provisional application No. 61/081,029, filed on Jul. 15, 2008.

(51) Int. Cl.
*H01L 21/311* (2006.01)

(52) U.S. Cl.
USPC ..... 438/694; 438/689; 438/706; 257/E21.215

(58) Field of Classification Search
USPC ............ 438/694, 689, 706, 707, 710, 712, 438/720; 257/E51.04, E21.215, E21.218, 257/E45.002
See application file for complete search history.

(56) References Cited

U.S. PATENT DOCUMENTS

| | | | |
|---|---|---|---|
| 5,915,167 A | 6/1999 | Leedy | |
| 6,034,882 A | 3/2000 | Johnson et al. | |
| 6,706,402 B2 | 3/2004 | Rueckes | |
| 6,952,030 B2 | 10/2005 | Herner et al. | |
| 7,176,064 B2 | 2/2007 | Herner | |
| 7,285,464 B2 | 10/2007 | Herner et al. | |
| 7,575,984 B2 | 8/2009 | Radigan | |
| 2003/0054656 A1* | 3/2003 | Soda | 438/710 |
| 2004/0082247 A1* | 4/2004 | Desai et al. | 442/340 |
| 2004/0136866 A1* | 7/2004 | Pontis et al. | 422/57 |
| 2005/0052915 A1 | 3/2005 | Herner et al. | |
| 2005/0214195 A1* | 9/2005 | Jung et al. | 423/445 B |
| 2005/0226067 A1 | 10/2005 | Herner et al. | |
| 2007/0004191 A1* | 1/2007 | Gu et al. | 438/618 |
| 2007/0246782 A1* | 10/2007 | Philipp et al. | 257/379 |
| 2008/0157257 A1* | 7/2008 | Bertin et al. | 257/476 |
| 2009/0166609 A1* | 7/2009 | Schricker et al. | 257/40 |
| 2009/0166610 A1 | 7/2009 | Schricker | |
| 2009/0168491 A1* | 7/2009 | Schricker et al. | 365/148 |

FOREIGN PATENT DOCUMENTS

WO   WO2008/021900   2/2008

OTHER PUBLICATIONS

Schricker, U.S. Appl. No. 12/415,964, filed Mar. 31, 2009.
Son, et al., "Electrical Switching in Metallic Carbon Nanotubes" Physical Review Letters, vol. 95, Issue 21, id 216602, 2005.

(Continued)

*Primary Examiner* — Leonard Chang
(74) *Attorney, Agent, or Firm* — Dugan & Dugan, PC

(57) ABSTRACT

Memory cells, and methods of forming such memory cells are provided that include a steering element coupled to a carbon-based reversible resistivity-switching material. In particular embodiments, methods in accordance with this invention etch a carbon nano-tube ("CNT") film formed over a substrate, the methods including coating the substrate with a masking layer, patterning the masking layer, and etching the CNT film through the patterned masking layer using a non-oxygen based chemistry. Other aspects are also described.

36 Claims, 4 Drawing Sheets

OTHER PUBLICATIONS

Malhi, et al., "Characteristics and three-dimensional intergration of MOSFETs in small grain LPCVD polysilicon", IEEE J. Solid State Circuits, vol. SSC-20, pp. 178-201, Feb. 1985.
International Search Report and Written Opinion dated Jun. 26, 2009, PCT Application No. PCT/US2009/040215.
EP Communication pursuant to Rules 161(1) and 162 EPC of counterpart EP Application No. 09730879.5 mailed Nov. 18, 2010.
Dec. 15, 2010 Reply to EP Communication pursuant to Rules 161(1) and 162 EPC of counterpart EP Application No. 09730879.5 mailed Nov. 18, 2010.
Oct. 8, 2012 Response to May 24, 2012 Office Action of related Chinese Patent Application Serial No. 200980122308.0.
Office Action of Chinese Patent Application Serial No. 200980122308.0 dated May 24, 2012.
Second Office Action in Chinese Patent Application No. 2009801223080 mailed Jan. 28, 2013.

\* cited by examiner

METHODS FOR ETCHING CARBON NANO-TUBE FILMS FOR USE IN NON-VOLATILE MEMORIES

CROSS-REFERENCE TO RELATED APPLICATIONS

This application claims the benefit of U.S. Provisional Patent Application Ser. No. 61/044,314, filed Apr. 11, 2008, and titled "Methods For Etching Carbon Nano-Tube Films For Use In Non-Volatile Memories," which is hereby incorporated by reference herein in its entirety for all purposes, and claims the benefit of U.S. Provisional Patent Application Ser. No. 61/081,029, filed Jul. 15, 2008, and titled "Methods For Etching Carbon Nano-Tube Films," each of which is hereby incorporated by reference herein in its entirety for all purposes.

TECHNICAL FIELD

This invention relates to non-volatile memories, and more particularly to a memory cell that includes a carbon-based memory element, and methods of forming the same.

BACKGROUND

Non-volatile memories formed from reversible resistance-switching elements are known. For example, U.S. patent application Ser. No. 11/968,154, filed Dec. 31, 2007, titled "MEMORY CELL THAT EMPLOYS A SELECTIVELY FABRICATED CARBON NANO-TUBE REVERSIBLE RESISTANCE-SWITCHING ELEMENT AND METHODS OF FORMING THE SAME" (the "'154 application"), which is hereby incorporated by reference herein in its entirety for all purposes, describes a rewriteable non-volatile memory cell that includes a diode coupled in series with a carbon-based reversible resistivity-switching material such as carbon.

However, fabricating memory devices from rewriteable resistivity-switching materials is technically challenging, and improved methods of forming memory devices that employ resistivity-switching materials are desirable.

SUMMARY

In a first aspect of the invention, a method of etching a carbon nano-tube ("CNT") film formed over a substrate is provided, the method including coating the substrate with a masking layer, patterning the masking layer, and etching the CNT film through the patterned masking layer using a non-oxygen based chemistry.

In a second aspect of the invention, a method of forming a memory cell is provided, the method including forming a layer of a CNT material above a substrate, and etching the CNT material in a plasma etch chamber using boron trichloride ($BCl_3$) and dichlorine ($Cl_2$) and a substrate bias power of between about 50 and about 150 Watts.

In a third aspect of the invention, a method of forming a memory cell is provided, the method including forming a layer of a CNT material above a substrate, and using a non-oxygen based chemistry to etch the CNT material to have nearly vertical sidewalls and little or no undercut of the CNT material.

Other features and aspects of this invention will become more fully apparent from the following detailed description, the appended claims and the accompanying drawings.

BRIEF DESCRIPTION OF THE DRAWINGS

Features of the present invention can be more clearly understood from the following detailed description considered in conjunction with the following drawings, in which the same reference numerals denote the same elements throughout.

DETAILED DESCRIPTION

Figure 1:
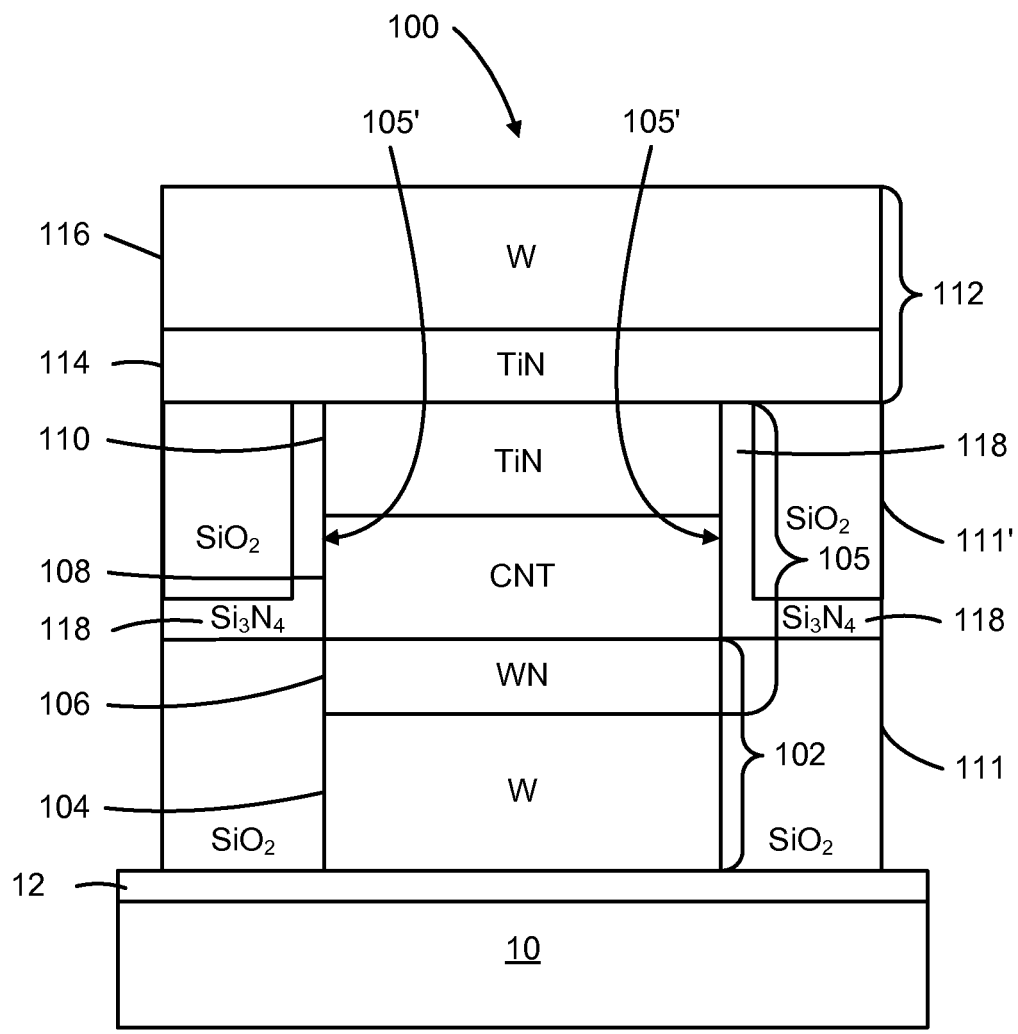
FIG. 1 depicts a cross-sectional, elevational schematic diagram of an exemplary memory cell in accordance with an embodiment of the present invention, the memory cell comprising a sidewall liner surrounding a metal-insulator-metal structure.

Certain carbon-based films, including but not limited to CNTs, graphene, amorphous carbon containing microcrystalline or other regions of graphene, and other graphitic carbon films, etc., may exhibit resistivity switching properties that may be used to form microelectronic non-volatile memories. Such films therefore are candidates for integration within a three-dimensional memory array. For instance, CNT materials have demonstrated memory switching properties on lab-scale devices with a 100× separation between ON and OFF states and mid-to-high range resistance changes. Such a separation between ON and OFF states renders CNT materials viable candidates for memory cells formed using the CNT materials in series with vertical diodes, thin film transistors or other steering elements.

In the aforementioned example, a metal-insulator-metal ("MIM") stack formed from a carbon-based material sandwiched between two metal or otherwise conducting layers may serve as a resistance change material for a memory cell. Moreover, a carbon-based MIM stack may be integrated in series with a diode or transistor to create a read-writable memory device as described, for example, in the '154 application.

However, when CNT material is used to form a memory cell, the deposited or grown CNT material often has a rough surface topography, with pronounced thickness variations, such as numerous peaks and valleys. The rough surface topography can cause difficulties in forming a memory cell. For example, the rough surface topography of CNT material can make CNT materials difficult to etch without excessive etching of the underlying substrate, increasing fabrication costs and complexity associated with their use in integrated circuits.

Exemplary methods in accordance with this invention form a memory cell that includes a memory element formed from CNT material. In particular, the CNT material may be etched using a plasma etcher and $BCl_3$ and $Cl_2$ chemistries under relatively low bias conditions (e.g., about 100 W). CNT material etched using such techniques have been observed to have nearly vertical sidewalls and little or no undercut of the CNT material.

In at least some embodiments, pure CNTs may be deposited by CVD growth techniques, colloidal spray on techniques, and spin on techniques. Additionally, carbon material deposition methods may include, but are not limited to, sputter deposition from a target, plasma-enhanced chemical vapor deposition ("PECVD"), PVD, CVD, arc discharge techniques, and laser ablation. Deposition temperatures may range from about 300° C. to 900° C. A precursor gas source may include, but is not limited to, hexane, cyclo-hexane, acetylene, single and double short chain hydrocarbons (e.g., methane), various benzene based hydrocarbons, polycyclic aromatics, short chain ester, ethers, alcohols, or a combination thereof. In some cases, a "seeding" surface may be used to promote growth at reduced temperatures (e.g., about 1-100 angstroms of iron ("Fe"), nickel ("Ni"), cobalt ("Co") or the like, although other thicknesses may be used).

In some embodiments, the carbon-based resistivity-switching material may be composed of amorphous carbon or a dielectric filler material mixed with graphitic carbon, deposited in any of the above mentioned techniques. A particular embodiment of this integration scheme includes a spin or spray application of the CNT material, followed by deposition of amorphous carbon from an Applied Materials, Inc., Producer™ tool for use as carbon-based liner material. The optional carbon-based protective liner can be deposited using a deposition technique similar to or different than that used to deposit the CNT material.

The carbon-based resistivity-switching material may be deposited in any thickness. In some embodiments, the carbon-based resistivity-switching material may be between about 1-1000 angstroms, although other thicknesses may be used. Depending on device construction, such as described herein, preferred ranges may include 200-400 angstroms, 400-600 angstroms, 600-800 angstroms, and 800-1000 angstroms.

EXEMPLARY EMBODIMENTS

In accordance with a first exemplary embodiment of this invention, formation of a microelectronic structure includes formation of an MIM device having a carbon film disposed between a bottom electrode and a top electrode, the carbon film comprising, for instance, a resistivity-switchable CNT layer. The structure also includes a dielectric sidewall liner provided to protect the carbon-based material from degradation during a dielectric fill step.

FIG. 1 is a cross-sectional elevational view of a first exemplary microelectronic structure 100, also referred to as memory cell 100, provided in accordance with this invention. Memory cell 100 includes a first conductor 102 formed over a substrate 10, such as over an insulating layer 12 over substrate 10. First conductor 102 may include a first metal layer 104, such as a tungsten ("W"), copper ("Cu"), aluminum ("Al"), gold ("Au"), or other metal layer. First conductor 102 may comprise a lower portion of an MIM layerstack structure 105 and function as a bottom electrode of MIM 105. An adhesion layer 106, such as a tungsten nitride ("WN"), titanium nitride ("TiN"), tantalum nitride ("TaN"), molybdenum ("Mo"), or similar layer, is optional but is shown in FIG. 1 formed over first metal layer 104. In general, a plurality of the first conductors 102 may be provided and isolated from one another (e.g., by employing silicon dioxide ("SiO$_2$") or other dielectric material isolation between each of first conductors 102). For instance, first conductor 102 may be a word-line or a bit-line of grid-patterned array.

A layer of CNT material 108 is formed over first conductor 102 using any suitable CNT formation process. CNT material 108 may comprise a middle portion of MIM layerstack structure 105, and function as a switching layer of MIM 105. CNT material 108 may be deposited by various techniques. One technique involves spray- or spin-coating a carbon nanotube suspension over first conductor 102, thereby creating a random CNT material. Another technique involves growing carbon nanotubes from a seed anchored to the substrate by CVD, PECVD or the like. Discussions of various CNT deposition techniques are found in the '154 application, and related U.S. patent application Ser. Nos. 11/968,156, "Memory Cell That Employs A Selectively Fabricated Carbon Nano-Tube Reversible Resistance-Switching Element Formed Over A Bottom Conductor And Methods Of Forming The Same," filed Dec. 31, 2007, and 11/968,159, "Memory Cell With Planarized Carbon Nanotube Layer And Methods Of Forming The Same," filed Dec. 31, 2007, which are hereby incorporated by reference herein in their entireties for all purposes.

In some embodiments in accordance with this invention, following deposition/formation of CNT material 108, an anneal step may be performed to modify the properties of the CNT material 108. In particular, the anneal may be performed in a vacuum or the presence of one or more forming gases, at a temperature in the range from about 350° C. to about 900° C., for about 30 to about 180 minutes. The anneal preferably is performed in about an 80% (N$_2$):20% (H$_2$) mixture of forming gases, at about 625° C. for about one hour.

Suitable forming gases may include one or more of N$_2$, Ar, and H$_2$, whereas preferred forming gases may include a mixture having above about 75% N$_2$ or Ar and below about 25% H$_2$. Alternatively, a vacuum may be used. Suitable temperatures may range from about 350° C. to about 900° C., whereas preferred temperatures may range from about 585° C. to about 675° C. Suitable durations may range from about 0.5 hour to about 3 hours, whereas preferred durations may range from about 1 hour to about 1.5 hours. Suitable pressures may range from about 1 mT to about 760 T, whereas preferred pressures may range from about 300 mT to about 600 mT.

This anneal may be performed prior to the formation of a top electrode above CNT material 108. A queue time of preferably about 2 hours between the anneal and the electrode metal deposition preferably accompanies the use of the anneal. A ramp up duration may range from about 0.2 hours to about 1.2 hours and preferably is between about 0.5 hours and 0.8 hours. Similarly, a ramp down duration also may range from about 0.2 hours to about 1.2 hours and preferably is between about 0.5 hours and 0.8 hours.

Although not wanting to be bound by any particular theory, it is believed that the CNT material may absorb water from the air and/or might have one or more functional groups attached to the CNT material after the CNT material is formed. Organic functional groups are sometimes required for pre-deposition processing. One of the preferred functional groups is a carboxylic group. Likewise, it is believed that the moisture and/or organic functional groups may increase the likelihood of delamination of the CNT material. In addition, it is believed that the functional groups may attach to the CNT material, for instance, during a cleaning and/or filtering process. The post-carbon-formation anneal may remove the moisture and/or carboxylic or other functional groups associated with the CNT material. As a result, in some embodiments, delamination of the CNT material and/or top electrode material from a substrate is less likely to occur if the CNT material is annealed prior to formation of the top electrode over the CNT material.

Incorporation of such a post-CNT-formation anneal preferably takes into account other layers present on the device that includes the CNT material, inasmuch as these other layers will also be subject to the anneal. For example, the anneal may be omitted or its parameters may be adjusted where the aforementioned preferred anneal parameters would damage the other layers. The anneal parameters may be adjusted within ranges that result in the removal of moisture and/or carboxylic or other functional groups without damaging the layers of the annealed device. For instance, the temperature may be adjusted to stay within an overall thermal budget of a device being formed. Likewise, any suitable forming gases, temperatures and/or durations may be used that are appropriate for a particular device. In general, such an anneal may be used with any c-based layer or carbon-containing material, such as layers having CNT material, graphite, graphene, amorphous carbon, etc.

In some embodiments in accordance with this invention, following deposition/formation of CNT material 108, an optional second carbon-based material layer (not shown) may be formed as a protective liner covering CNT material 108, such as described in commonly owned, co-pending U.S. patent application Ser. No. 12/415,964, filed Mar. 31, 2009, and titled "Electronic Devices Including Carbon-Based Films Having Sidewall Liners, And Methods Of Forming Such Devices" (the "'964 application"), which is incorporated by reference herein in its entirety for all purposes.

After formation of CNT material 108, an adhesion/barrier layer 110, such as TiN, TaN, W, WN, tantalum carbon nitride ("TaCN"), or the like, may be formed over CNT material 108. As shown in FIG. 1, adhesion layer 110 may function as a top electrode of MIM device 105 that includes CNT material 108 as the switching layer, and first metal layer 104 and optional adhesion layer 106 as the bottom electrode. As such, the following sections refer to adhesion/barrier layer 110 as "top electrode 110" of MIM 105.

In some embodiments in accordance with this invention, top electrode 110 may be deposited using a lower energy deposition technique, e.g., one involving energy levels lower than those used in PVD of similar materials. Such exemplary deposition techniques may include non-conformal deposition, low bias power physical vapor deposition ("LBP-PVD"), low temperature PVD, and other similar techniques. Use of a non-conformal, lower energy deposition technique to deposit top electrode 110 on the carbon material may reduce the potential for deposition-associated damage to CNT material 108 and the potential for infiltration and/or penetration of CNT material 108 by top electrode 110. In embodiments foregoing the use of an optional carbon liner, use of lower energy deposition techniques may be particularly advantageous to limit the deleterious effects of the deposition of top electrode 110. Metal deposition techniques that are non-conformal have a lower likelihood of depositing metal into a pore in the CNT material 108.

The layerstack of layers 108 and 110 may be patterned, for example, with about 1 to about 1.5 micron, more preferably about 1.2 to about 1.4 micron, of photoresist ("PR") using standard photolithographic techniques. Thinner PR layers may be used with smaller critical dimensions and technology nodes. In some embodiments, an oxide hard mask may be used below the PR layer to improve pattern transfer and protect underlying layers during etching.

As previously mentioned, CNT material typically has a rough surface topography, with pronounced thickness variations that make CNT material difficult to etch. Methods in accordance with this invention provide methods of etching CNT material 108 using non-oxygen-based chemistries that may be fully compatible with standard semiconductor tooling and/or processing equipment. For simplicity, the remaining discussion will refer to exemplary techniques for etching CNT material 108. Person of ordinary skill in the art will understand that the same techniques may be used to etch top electrode 110.

In particular, in at least some embodiments of the invention, CNT material 108 may be etched using boron trichloride ($BCl_3$) and dichlorine ($Cl_2$) chemistries. For example, CNT material 108 may be etched in a plasma etch chamber using $BCl_3$ and $Cl_2$ gas flow inputs, generating reactive species such as chlorine ions (Cl+) that may be used to etch CNT material 108. The ratio of $BCl_3$ to $Cl_2$ may be about 4:1 to about 1.8:1, more generally about 70:1 to about 3:5. In at least one embodiment, an approximately 5:2 ratio of $BCl_3$ to $Cl_2$ may be employed to etch CNT material 108 with a substrate bias power of about 100 Watts and a plasma power of about 450 Watts. Exemplary processing conditions for a plasma etch process for etching CNT material 108 are provided below in Table 1. Other ratios, flow rates, chamber pressures, power levels, process temperatures, and/or etch rates may be used.

TABLE 1

EXEMPLARY PLASMA ETCH PROCESS PARAMETERS

| PROCESS PARAMETER | EXEMPLARY RANGE | PREFERRED RANGE |
|---|---|---|
| $BCl_3$ Flow Rate (sccm) | 30-70 | 45-60 |
| $Cl_2$ Flow Rate (sccm) | 0-50 | 15-25 |
| Pressure (milliTorr) | 50-150 | 80-100 |
| Substrate Bias RF (Watts) | 50-150 | 85-110 |
| Plasma RF (Watts) | 350-550 | 390-410 |
| Process Temperature (° C.) | 45-75 | 60-70 |
| Etch Rate (Å/sec) | 3-10 | 4-5 |

In accordance with alternative embodiments of this invention, CNT material 108 may be etched using chlorine and argon chemistries. For example, CNT material 108 may be etched in a plasma etch chamber using $BCl_3$, $Cl_2$ and argon gas flow inputs, generating reactive species such as chlorine ions (Cl+) and argon ions (Ar+) that may etch a CNT material. The ratio of $BCl_3$:$Cl_2$:Ar may be about 4:1:1 to about 1.8:1:1, more generally about 70:1:1: to about 3:5:5. In at least one embodiment, an approximately 5:2:2 ratio of $BCl_3$:$Cl_2$:Ar may be employed to etch CNT material 108 with a substrate bias power of about 100 Watts and a plasma power of about 450 Watts may be used. Exemplary processing conditions for a plasma etch process for a CNT material are provided below in Table 2. Other ratios, flow rates, chamber pressures, power levels, process temperatures, and/or etch rates may be used.

TABLE 2

EXEMPLARY PLASMA ETCH PROCESS PARAMETERS

| PROCESS PARAMETER | EXEMPLARY RANGE | PREFERRED RANGE |
|---|---|---|
| $BCl_3$ Flow Rate (sccm) | 30-70 | 45-60 |
| $Cl_2$ Flow Rate (sccm) | 0-50 | 15-25 |
| Argon Flow Rate (sccm) | 0-50 | 15-25 |
| Pressure (milliTorr) | 50-150 | 80-100 |
| Substrate Bias RF (Watts) | 100-200 | 125-175 |
| Plasma RF (Watts) | 350-550 | 390-410 |
| Process Temperature (° C.) | 45-75 | 60-70 |
| Etch Rate (Å/sec) | 10-20 | 13.8-14.5 |

In some embodiments, top electrode 110 and CNT material 108 may be patterned using a single etch step. In other embodiments, separate etch steps may be used. For example, top electrode 110 may be etched using a chlorine process (similar to that of Table 1, or Table 2 without the argon flow), and CNT material 108 may be etched using a chlorine-argon chemistry (similar to that of Table 2). In other embodiments, a single etch procedure may be used (e.g., using a chlorine-argon chemistry as in Table 2). Studies have shown that using argon during the etch may increase the etch rate of CNT material 108.

The etch of top electrode 110 and CNT material 108 proceeds down to first conductor 102 and exposes gap fill material 111. Such an etched layerstack has been observed to have nearly vertical sidewalls 105' and little or no undercut of the CNT material 108.

In some embodiments, prior to etching top electrode 110 and CNT material 108, the PR may be ashed using standard procedures. In other embodiments the PR is ashed after etching CNT material 108. In embodiments in which the PR is ashed, the CNT etch may include about 45-60 sccm of $BCl_3$, about 15-25 sccm of $Cl_2$ and about 15-25 sccm of Argon using about 125-175 Watts bias for about 55-65 seconds. In embodiments in which the PR is not ashed, the identical conditions may be used with a longer etch time (e.g., about 60-70 seconds). In either case, a chuck temperature of 60-70° C. may be employed during the CNT etch. Exemplary ranges for the CNT dry etch include about 100 to 250 Watts bias, about 45 to 85° C. chuck temperature, and a gas ratio range of about 2:1 to 5:1 $BCl_3:Cl_2$ and about 5:1 $Ar:Cl_2$ to no argon. The etch time may be proportional to the CNT thickness.

If ashing is performed after CNT material 108 has been etched, for example, the bias and/or directionality component of the ashing process may be increased and the pressure of oxygen during the ashing process may be reduced. Both attributes may help to reduce undercutting of CNT material 108. Any suitable ashing tool may be used, such as an Iridia asher available from GaSonics International of San Jose, Calif.

In at least some embodiments, an ashing procedure including two steps is used. Exemplary process conditions for the first ashing step are provided in Table 3 below. Exemplary process conditions for the second ashing step are provided in Table 4 below. Other flow rates, pressures, RF powers and/or times may be used.

TABLE 3

EXEMPLARY $1^{ST}$ ASHING STEP PROCESS PARAMETERS

| PROCESS PARAMETER | EXEMPLARY RANGE | PREFERRED RANGE |
|---|---|---|
| $CF_4$ Flow Rate (sccm) | 10-50 | 20-30 |
| $N_2H_2$ Flow Rate (sccm) | 80-120 | 90-110 |
| $H_2O_2$ Flow Rate (sccm) | 200-350 | 260-290 |
| Pressure (milliTorr) | 600-800 | 650-750 |
| Substrate Bias RF (Watts) | 0 | 0 |
| Plasma RF (Watts) | 350-450 | 400-430 |
| Time (seconds) | 20-120 | 50-70 |

TABLE 4

EXEMPLARY $2^{ND}$ ASHING STEP PROCESS PARAMETERS

| PROCESS PARAMETER | EXEMPLARY RANGE | PREFERRED RANGE |
|---|---|---|
| $O_2$ Flow Rate (sccm) | 350-450 | 380-420 |
| Pressure (milliTorr) | 200-600 | 380-440 |
| Substrate Bias RF (Watts) | 50-200 | 90-120 |
| Plasma RF (Watts) | 350-450 | 400-430 |
| Time (seconds) | 20-120 | 50-70 |

The bias power may be increased from zero for normal processing, and the ashing time may be proportional to the thickness of the PR used.

After the etch of the top electrode 110 and CNT material 108, the layerstack may be cleaned prior to formation of additional dielectric gap fill 111'. Data indicate that a CNT layer delaminates in EKC type cleans, so after the stack is etched, a dilute hydrofluoric/sulfuric acid clean is performed. Post CNT etch cleaning, whether or not PR ashing is performed before CNT etching, may be performed in any suitable cleaning tool, such as a Raider tool, available from Semitool of Kalispell, Mont. Exemplary post-CNT-etch cleaning may include using ultra-dilute sulfuric acid (e.g., about 1.5-1.8 wt %) for about 60 seconds and ultra-dilute hydrofluoric ("HF") acid (e.g., about 0.4-0.6 wt %) for 60 seconds. Megasonics may or may not be used. Following such cleaning, no residual photoresist was observed. If photoresist does come into contact with CNT material, the PR is hard to remove, and the electrical performance of the CNT material suffers.

As such, an exemplary sequence of steps to etch and clean the stack is as follows: (1) pattern the PR; (2) transfer the pattern into an oxide hard mask; (3) ash away the PR (an ash tool may be here because the metal protects the CNT); (4) clean using dilute hydrofluoric and sulfuric acid cleans; (5) etch the stack using $BCl_3$ and $Cl_2$ chemistries (no post-etch ashing is used because CNT is exposed); and (6) clean again using dilute HF/sulfuric acid cleans. Following the etch and clean steps, a dielectric sidewall liner may be formed.

After cleaning, deposition of gap fill conventionally would occur. Conventional PECVD techniques, however, for depositing dielectric gap fill material 111' may employ an oxygen plasma component that is created in the initial stages of deposition. This initial oxygen plasma may harm CNT material 108, causing undercutting and poor electrical performance. To avoid such harm, methods in accordance with this invention form a dielectric sidewall liner 118 to protect sidewalls 105' of CNT material 108 during deposition of the remaining gap-fill dielectric 111' (e.g., $SiO_2$).

Dielectric sidewall liner 118 is deposited using a deposition chemistry that has a low oxygen content, which produces an "oxygen-poor" dielectric. In one exemplary embodiment, a silicon nitride dielectric sidewall liner 118 followed by a standard PECVD $SiO_2$ dielectric fill 111' may be used. Whereas stoichiometric silicon nitride is $Si_3N_4$, silicon nitride (or simply "SiN") is used herein to refer to stoichiometric and non-stoichiometric silicon nitride alike.

In the embodiment of FIG. 1, dielectric sidewall liner 118 is deposited conformally over the etched layerstack of top electrode/aC/CNT features before gap fill portion 111', e.g., the remainder of the dielectric gap fill, is deposited. Dielectric sidewall liner 118 preferably covers outer sidewalls 105' of CNT material 108 and isolates them from dielectric fill 111'. If CNT material 108 is overetched, such that etching of underlying dielectric gap fill material 111 occurs, dielectric sidewall liner 118 may extend below CNT material 108.

In some embodiments, dielectric sidewall liner 118 may comprise about 200 to about 500 angstroms of SiN. However, the structure optionally may comprise other layer thicknesses and/or other materials, such as $Si_xC_yN_z$ and $Si_xO_yN_z$ (with low O content), etc., where x, y and z are non-zero numbers resulting in stable compounds.

The defined top electrode/CNT features may be isolated with $SiO_2$ or other dielectric fill 111', and then planarized to co-expose top electrode 110, gap fill 111' and dielectric sidewall liner 118. A second conductor 112 may be formed over the planar surface, exposing top electrode 110. Second conductor 112 may include a barrier/adhesion layer 114, such as TiN, TaN, WN, Mo, or a similar material, and a metal layer 116 (e.g., tungsten or other conductive material).

MIM device 105 may serve as a resistance-switchable memory element for memory cell 100. CNT material 108 may form a resistivity-switchable portion of the memory element of the memory cell, wherein the memory element is adapted to switch between two or more resistivity states. For example, MIM device 105 may be coupled in series with a steering element such as a diode, a tunnel junction, or a thin film transistor ("TFT"). In at least one embodiment, the steering element may include a polycrystalline vertical diode.

Memory operation is based on a bi-stable resistance change in the CNT stackable layer 108 with the application of high bias voltage (e.g., >4 V). Current through the memory cell is modulated by the resistance of CNT material 108. The memory cell is read at a lower voltage that will not change the resistance of CNT material 108. In some embodiments, the difference in resistivities between the two states may be over 100×. The memory cell may be changed from a "0" to a "1," for example, with the application of high forward bias on the steering element (e.g., a diode). The memory cell may be changed back from a "1" to a "0" with the application of a high forward bias. As stated, this integration scheme can be extended to include CNT materials in series with a TFT or tunnel junction as the steering element instead of a vertical pillar diode. The TFT or tunnel junction steering element may be either planar or vertical.

In accordance with a second exemplary embodiment of this invention, formation of a microelectronic structure includes formation of a diode in series with an MIM device, having a carbon film disposed between a bottom electrode and a top electrode, and a dielectric sidewall liner provided to protect the carbon-based material from degradation during a dielectric fill step. The dielectric liner and its use are compatible with standard semiconductor tooling.

Figure 2A:
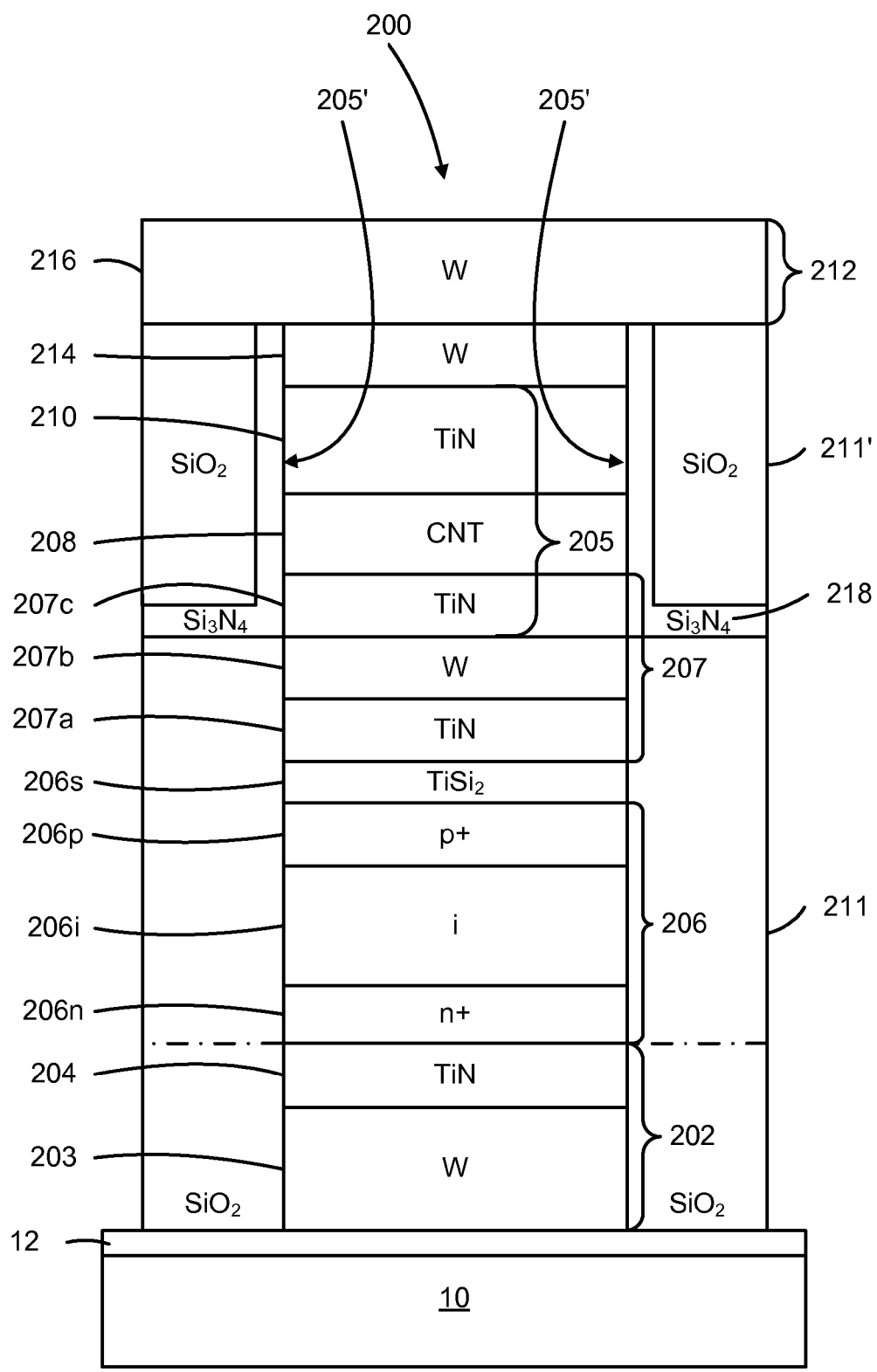
FIGS. 2A and 2B depict elevational cross-sections of other exemplary memory cells in accordance with embodiments of the present invention, each memory cell comprising a sidewall liner surrounding a metal-insulator-metal structure in series with a diode.
Figure 2B:
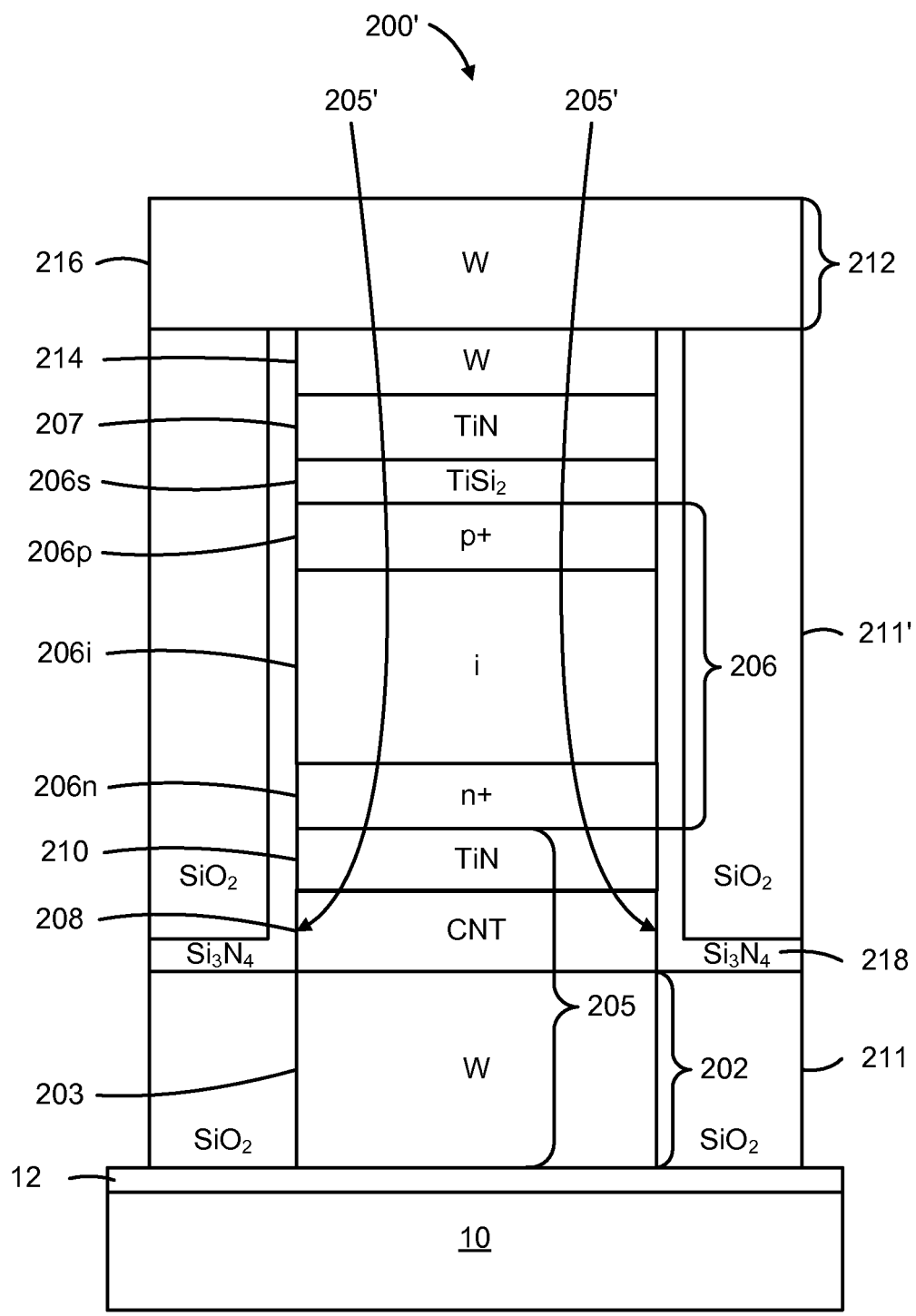

FIG. 2 is a cross-sectional elevational view of an exemplary memory cell structure 200 provided in accordance with the present invention. FIGS. 2A and 2B depict layers of the memory cell formed in different orders. In FIG. 2A, memory cell structure 200 includes a diode disposed below an MIM device having a dielectric sidewall liner and a CNT film disposed between a bottom electrode and a top electrode. In FIG. 2B, memory cell structure 200' has the diode disposed above the MIM device.

As shown in FIG. 2A, memory cell structure 200 includes a first conductor 202 formed over substrate 10. First conductor 202 may include a first metal layer 203, such as a W, Cu, Al, Au, or other metal layer, with a first barrier/adhesion layer 204, such as a TiN, TaN or similar layer, formed over first metal layer 203. First conductor 202 may comprise a lower portion of an MIM layerstack structure 205 and function as a bottom electrode of MIM 205, as shown in FIG. 2B. In general, a plurality of first conductors 202 may be provided, e.g., patterned and etched, and isolated from one another, e.g., by employing SiO$_2$ or other dielectric material isolation between each of first conductors 202.

A vertical P-I-N (or N-I-P) diode 206 is formed above first conductor 202. For example, diode 206 may include a polycrystalline (e.g., polysilicon, polygermanium, silicon-germanium alloy, etc.) diode. Diode 206 may include a layer 206n of semiconductor material heavily doped a dopant of a first-type (e.g., n-type), a layer 206i of intrinsic or lightly doped semiconductor material, and a layer 206p of semiconductor material heavily doped a dopant of a second-type (e.g., p-type). Alternatively, the vertical order of diode 206 layers 206n, 206i, and 206p may be reversed, analogous to diode 206 shown in FIG. 2B.

In some embodiments, an optional silicide region 206s may be formed over diode 206. As described in U.S. Pat. No. 7,176,064, which is hereby incorporated by reference herein in its entirety for all purposes, silicide-forming materials, such as titanium and cobalt, react with deposited silicon during annealing to form a silicide layer. The lattice spacings of titanium silicide and cobalt silicide are close to that of silicon, and it appears that such silicide layers may serve as "crystallization templates" or "seeds" for adjacent deposited silicon as the deposited silicon crystallizes (e.g., the silicide layer enhances the crystalline structure of diode 206 during annealing). Lower resistivity silicon thereby is provided. Similar results may be achieved for silicon-germanium alloy and/or germanium diodes. In some embodiments using silicide region 206s to crystallize diode 206, silicide region 206s may be removed after such crystallization, so that silicon region 206s does not remain in the finished structure.

A TiN or other adhesion/barrier layer or layer stack 207 may be formed above diode 206. In some embodiments, adhesion/barrier layer 207 may comprise a layer stack 207 including a first adhesion/barrier layer 207a, a metal layer 207b, such as of W, and a further adhesion/barrier layer 207c, such as of TiN.

In the event that a layerstack 207 is used, layers 207a and 207b may serve as a metal hard mask that may act as a chemical mechanical planarization ("CMP") stop layer and/or etch-stop layer. Such techniques are disclosed, for example, in U.S. patent application Ser. No. 11/444,936, "CONDUCTIVE HARD MASK TO PROTECT PATTERNED FEATURES DURING TRENCH ETCH," filed May 31, 2006, which is hereby incorporated by reference herein in its entirety for all purposes. For instance, diode 206 and layers 207a and 207b may be patterned and etched to form pillars, and dielectric fill material 211 may be formed between the pillars. The stack may then be planarized, such as by CMP or etch-back, to co-expose gap fill 211 and layer 207b. Layer 207c may then be formed on layer 207b. Alternatively, layer 207c may be patterned and etched along with diode 206 and layers 207a and 207b. In some embodiments, layer 207c may be eliminated, and the CNT material may interface directly with metal layer 207b (e.g., W).

Thereafter, a CNT material 208 may be formed over the adhesion/barrier layer or layer stack 207 using any suitable CNT formation process (as described previously). Following deposition/formation of CNT material 208, an optional second carbon-based material layer (not shown) may be formed as a protective liner covering CNT material 208, as described above. Following deposition/formation of CNT material 208, a second adhesion/barrier layer 210, such as TiN, TaN, WN, Mo, or the like, is formed over CNT material 208.

As shown in FIG. 2A, adhesion layer 207 may function as a bottom electrode of MIM layerstack 205 that includes CNT material 208 as the switching layer, and an adhesion layer 210 as a top electrode. As such, the following sections refer to adhesion/barrier layer 207 as "bottom electrode 207" with respect to FIG. 2A. Similarly, adhesion/barrier layer 210 is referred to as "top electrode 210" of the MIM 205 of FIG. 2A as well as FIG. 2B. Top electrode 210 may be deposited using a lower energy deposition technique, as discussed above. An additional hard mask and/or CMP stop layer 214 also may be formed (as shown).

Before formation of a top conductor 212, which may include an adhesion layer (not shown) and a conductive layer 216, the layerstack may be patterned and etched, as discussed above in reference to FIG. 1. If an etching process was performed to create the pillars mentioned above, then the etch may apply to layers 208, 210, and possibly 207c and 214. For example, layers 214, 210 may serve as a hard mask and/or CMP stop for CNT material 208.

In some embodiments, CNT material 208 may be etched using a different etch step than the etch step used for second adhesion/barrier layer 210. In other embodiments, a single etch step may be used. Such an etched film stack has been observed to have nearly vertical sidewalls 205' and little or no undercut of CNT material 208. In some embodiments, CNT material 208 may be overetched such that etching of underlying dielectric gap fill material 211 may occur.

After the etch of the top electrode 210 and CNT material 208, the layerstack may be cleaned prior to deposition of additional dielectric gap fill 211'. After cleaning, and before deposition of gap fill 211', a dielectric sidewall liner 218 may be formed with an oxygen-poor deposition chemistry (e.g., without a high oxygen plasma component) to protect the sidewalls 205' of the CNT material 208 during deposition of an oxygen-rich gap-fill dielectric 211' (e.g., $SiO_2$). The dielectric sidewall liner 218 also may be referred to as a pre-dielectric fill liner.

In the embodiment of FIG. 2, a silicon nitride dielectric sidewall liner 218 followed by a standard PECVD $SiO_2$ dielectric fill 211' may be used. The silicon nitride dielectric sidewall liner 218 may comprise stoichiometric and/or non-stoichiometric silicon nitride. In some embodiments, the dielectric sidewall liner 218 may comprise about 200 to about 500 angstroms of SiN. However, the structure optionally may comprise other layer thicknesses and/or other materials, such as $Si_xC_yN_z$ and $Si_xO_yN_z$ (with low O content), etc., where x, y and z are non-zero numbers resulting in stable compounds.

The dielectric sidewall liner 218 is deposited conformally over the layerstack of top electrode/aC/CNT features before gap fill portion 211', e.g., the remainder of the dielectric gap fill, is deposited. The dielectric sidewall liner 218 preferably covers the outer sidewalls 205' of the CNT material 208 and isolates them from the dielectric fill 211'. In embodiments in which the CNT material 208 is overetched such that etching of underlying dielectric gap fill material 211 occurs, the dielectric sidewall liner 218 may extend below CNT material 108.

After the defined layerstack of top electrode/CNT features are isolated, with $SiO_2$ or other dielectric fill 211', they are planarized to co-expose top electrode 210, gap fill 211', and SiN dielectric sidewall liner 218. A second conductor 212 is formed over second adhesion/barrier layer 210, or layer 214, if layer 214 is used as a hard mask and etched along with layers 208 and 210. Second conductor 212 may include a barrier/adhesion layer, such as TiN, TaN, WN, or a similar layer, as shown in FIGS. 1 and 2, and a metal layer 216, such as a W or other conductive layer.

In contrast to FIG. 1, FIG. 2 depicts a layer 214 of tungsten deposited on adhesion/barrier layer 210 before the stack is etched, so that layer 214 is etched as well. Layer 214 may act as a metal hard mask to assist in etching the layers beneath it. Insofar as layers 214 and 216 both may be tungsten, they should adhere to each other well. Optionally, a $SiO_2$ hard mask may be used.

In one exemplary embodiment, a SiN dielectric sidewall liner 218 may be formed, such as described in the '964 application, referenced above.

As shown in FIG. 2B, microelectronic structure 200' may include the diode 206 positioned above CNT material 208, causing some rearrangement of the other layers. In particular, CNT material 208 may be deposited either on an adhesion/barrier layer 204, as shown in FIG. 2A, or directly on lower conductor 202, as shown in FIG. 2B. Tungsten from a lower conductor may assist catalytically in formation of CNT material 208, e.g., if grown. Tungsten also appears to adhere well to carbon. An adhesion/barrier layer 210 may be formed directly on carbon-based switching layer 208, followed by formation of diode 206, including possible silicide region 206s. An adhesion/barrier layer 207 may be formed on diode 206 (with or without silicide region 206s).

FIG. 2B depicts a layer 214, such as tungsten, on layer 207, and layer 214 may serve as a metal hard mask and/or adhesion layer to metal layer 216 of second conductor 212, preferably also made of tungsten. The stack may be patterned and etched into a pillar, as described above. In some embodiments, the entire layerstack of layers 206, 207, 208, 210, and 214 may be patterned using a single photolithography step.

Above an optional oxide hard mask, or in place thereof, mentioned with respect to FIG. 1, a layer of silicon may be formed and used as a shrinkable hard mask to further reduce the feature size, e.g., critical dimension. In some embodiments, the silicon is amorphous as deposited using a PECVD technique. After patterning the PR layer and etching the pattern into the amorphous silicon to form a silicon hard mask, the silicon hard mask may be shrunk to reduce the critical dimension of the pattern.

Dielectric sidewall liner 218 may be deposited conformally on the pillar and dielectric fill 211 that isolates first conductors 202. In this case, dielectric sidewall liner 218 may extend upward along the entire height of the layerstack between first conductor 202 and second conductor 212. Planarization to co-expose the gap fill 211', metal hard mask layer 214, and dielectric sidewall liner 218 is followed by formation of top conductor 212 to achieve the structure 200' shown in FIG. 2B.

In accordance with a third exemplary embodiment of this invention, formation of a microelectronic structure includes formation of a monolithic three dimensional memory array including memory cells, each memory cell comprising an MIM device having a carbon-based memory element disposed between a bottom electrode and a top electrode and covered by a dielectric sidewall liner. The carbon-based memory element may comprise an optional carbon-based protective layer covering undamaged, or reduced-damage, CNT material that is not penetrated, and preferably not infiltrated, by the top electrode. The top electrode in the MIM optionally may be deposited using a lower energy deposition technique.

Figure 3:
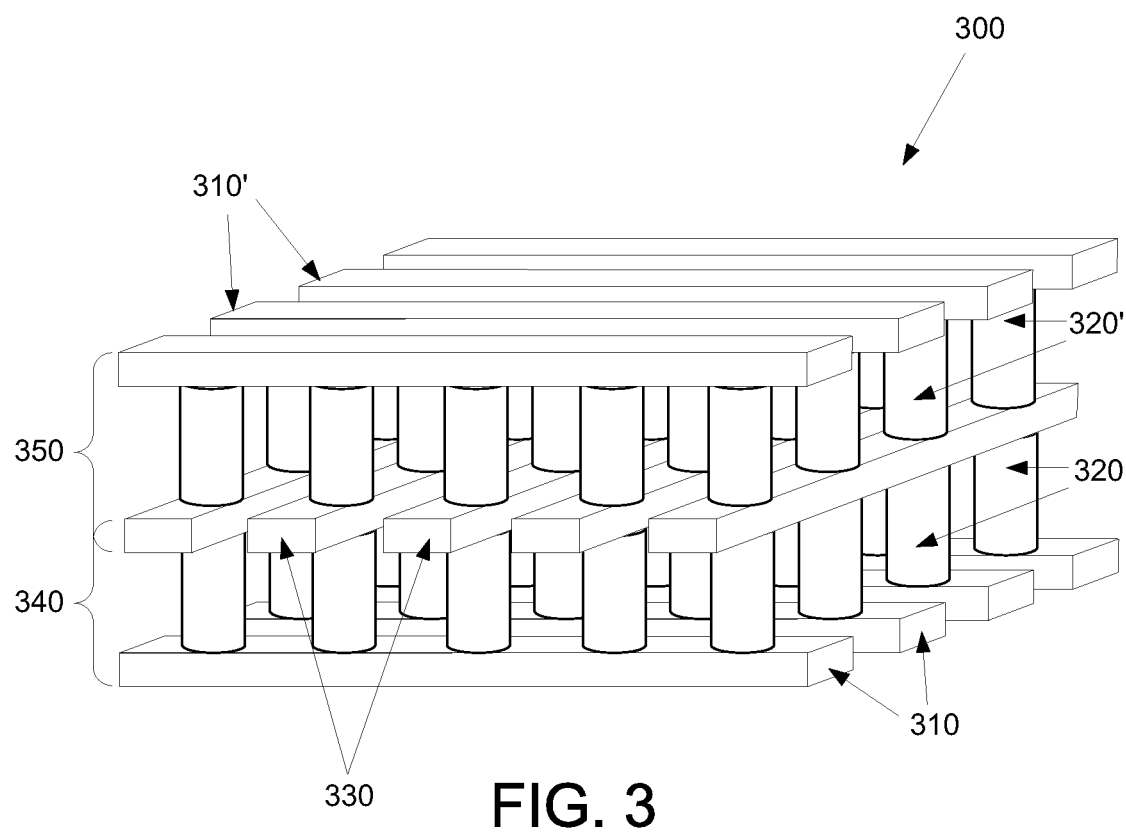
FIG. 3 is a perspective view of an exemplary memory level of a monolithic three dimensional memory array provided in accordance with the present invention.

FIG. 3 shows a portion of a memory array 300 of exemplary memory cells formed according to the third exemplary embodiment of the present invention. A first memory level is formed above the substrate, and additional memory levels may be formed above it. Details regarding memory array formation are described in the applications incorporated by reference herein, and such arrays may benefit from use of the methods and structures according to embodiments of the present invention.

As shown in FIG. 3, memory array 300 may include first conductors 310 and 310' that may serve as wordlines or bitlines, respectively; pillars 320 and 320' (each pillar 320, 320' comprising a memory cell); and second conductors 330, that may serve as bitlines or wordlines, respectively. First conductors 310, 310' are depicted as substantially perpendicular to second conductors 330. Memory array 300 may include one or more memory levels. A first memory level 340 may include the combination of first conductors 310, pillars 320 and second conductors 330, whereas a second memory level 350 may include second conductors 330, pillars 320' and first conductors 310'. Fabrication of such a memory level is described in detail in the applications incorporated by reference herein.

Embodiments of the present invention are useful in formation of a monolithic three dimensional memory array. A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167. The substrates may be thinned or removed from the memory levels before bonding, but as the memory levels are initially formed over separate substrates, such memories are not true monolithic three dimensional memory arrays.

A related memory is described in Herner et al., U.S. patent application Ser. No. 10/955,549, "Nonvolatile Memory Cell Without A Dielectric Antifuse Having High- And Low-Impedance States," filed Sep. 29, 2004 (hereinafter the '549 application), which is hereby incorporated by reference herein in its entirety for all purposes. The '549 application describes a monolithic three dimensional memory array including vertically oriented p-i-n diodes like diode 206 of FIG. 2. As formed, the polysilicon of the p-i-n diode of the '549 application is in a high-resistance state. Application of a programming voltage permanently changes the nature of the polysilicon, rendering it low-resistance. It is believed the change is caused by an increase in the degree of order in the polysilicon, as described more fully in Herner et al., U.S. patent application Ser. No. 11/148,530, "Nonvolatile Memory Cell Operating By Increasing Order In Polycrystalline Semiconductor Material," filed Jun. 8, 2005 (the "'530 application"), which is incorporated by reference herein in its entirety for all purposes.

Another related memory is described in Herner et al., U.S. Pat. No. 7,285,464, (the "'464 patent"), which is incorporated by reference herein in its entirety. As described in the '464 patent, it may be advantageous to reduce the height of the p-i-n diode. A shorter diode requires a lower programming voltage and decreases the aspect ratio of the gaps between adjacent diodes. Very high-aspect ratio gaps are difficult to fill without voids. A thickness of at least 600 angstroms is preferred for the intrinsic region to reduce current leakage in reverse bias of the diode. Forming a diode having a silicon-poor intrinsic layer above a heavily n-doped layer, the two separated by a thin intrinsic capping layer of silicon-germanium, will allow for sharper transitions in the dopant profile, and thus reduce overall diode height.

In particular, detailed information regarding fabrication of a similar memory level is provided in the '549 application and the '464 patent, previously incorporated. More information on fabrication of related memories is provided in Herner et al., U.S. Pat. No. 6,952,030, "A High-Density Three-Dimensional Memory Cell," owned by the assignee of the present invention and hereby incorporated by reference herein in its entirety for all purposes. To avoid obscuring the present invention, this detail will be not be reiterated in this description, but no teaching of these or other incorporated patents or applications is intended to be excluded. It will be understood that the above examples are non-limiting, and that the details provided herein can be modified, omitted, or augmented while the results fall within the scope of the invention.

The foregoing description discloses exemplary embodiments of the invention. Modifications of the above disclosed apparatus and methods that fall within the scope of the invention will be readily apparent to those of ordinary skill in the art. Accordingly, although the present invention has been disclosed in connection with exemplary embodiments, it should be understood that other embodiments may fall within the spirit and scope of the invention, as defined by the following claims.

The invention claimed is:

1. A method comprising:
forming a carbon nano-tube ("CNT") film over a substrate;
forming a protective liner over the CNT film;
forming an electrode over the protective liner;
coating the substrate with a masking layer;
patterning the masking layer;
etching the electrode, the protective liner and the CNT film through the patterned masking layer in a single etch step using a non-oxygen based chemistry and a substrate bias power of between about 50 and about 150 Watts;
forming a dielectric sidewall liner on sidewalls of the etched CNT film; and
forming a steering element coupled to the etched CNT film.

2. The method of claim 1, wherein etching the CNT film includes:
loading the substrate into an plasma etch chamber; and
etching the substrate using boron trichloride ("$BCl_3$") and dichlorine ("$Cl_2$").

3. The method of claim 2, wherein etching the substrate comprises using a ratio of $BCl_3$ to $Cl_2$ of about 70:1 to about 3:5.

4. The method of claim 2, wherein etching the substrate comprises using a ratio of $BCl_3$ to $Cl_2$ of about 4:1 to about 1.8:1.

5. The method of claim 2, wherein etching the substrate comprises using a ratio of $BCl_3$ to $Cl_2$ of about 5:2.

6. The method of claim 2, wherein etching the substrate further comprises using argon ("Ar").

7. The method of claim 6, wherein etching the substrate comprises using a ratio of $BCl_3$ to $Cl_2$ to Ar of about 70:1:1 to about 3:5:5.

8. The method of claim 6, wherein etching the substrate comprises using a ratio of $BCl_3$ to $Cl_2$ to Ar of about 4:1:1 to about 1.8:1:1.

9. The method of claim 6, wherein etching the substrate comprises using a ratio of $BCl_3$ to $Cl_2$ to Ar of about 5:2:2.

10. The method of claim 2, wherein the masking layer includes photoresist.

11. The method of claim 10 further comprising asking the photoresist.

12. The method of claim 11, wherein the photoresist is ashed before etching the substrate.

13. The method of claim 11, wherein the photoresist is ashed after etching the substrate.

14. The method of claim 11, wherein ashing comprises a two-step ashing procedure.

15. A memory cell formed using the method of claim 1.

16. A method of forming a memory cell, the method comprising:
forming a layer of a carbon nanotube ("CNT") material above a substrate;
forming a protective liner over the CNT material;
forming an electrode over the protective liner;
etching the electrode, the protective liner and the CNT material in a single etch step in a plasma etch chamber using boron trichloride ($BCl_3$) and dichlorine ($Cl_2$), and a substrate bias power of between about 50 and about 150 Watts;
forming a dielectric sidewall liner on sidewalls of the etched CNT material; and
forming a steering element coupled to the etched CNT material.

17. The method of claim 16, wherein the substrate bias power is between about 85 and about 110 Watts.

18. The method of claim 16, wherein the substrate bias power is about 100 Watts.

19. The method of claim 16, wherein etching the CNT material comprises using a ratio of $BCl_3$ to $Cl_2$ of about 70:1 to about 3:5.

20. The method of claim 16, wherein etching the substrate comprises using a ratio of $BCl_3$ to $Cl_2$ of about 4:1 to about 1.8:1.

21. The method of claim 16, wherein etching the substrate comprises using a ratio of $BCl_3$ to $Cl_2$ of about 5:2.

22. The method of claim 17, wherein etching the substrate further comprises using argon ("Ar").

23. The method of claim 22, wherein etching the substrate comprises using a ratio of $BCl_3$ to $Cl_2$ to Ar of about 70:1:1 to about 3:5:5.

24. The method of claim 22, wherein etching the substrate comprises using a ratio of $BCl_3$ to $Cl_2$ to Ar of about 4:1:1 to about 1.8:1:1.

25. The method of claim 22, wherein etching the substrate comprises using a ratio of $BCl_3$ to $Cl_2$ to Ar of about 5:2:2.

26. The method of claim 16, wherein the steering element comprises a diode.

27. The method of claim 26, wherein forming the steering element comprises:
    forming one or more layers of silicon above the substrate; and
    etching the one or more layers of silicon.

28. The method of claim 27, comprising etching the one or more layers of silicon and the CNT layer in a single etching step.

29. The method of claim 27, comprising etching the one or more layers of silicon and the CNT layer separately.

30. A memory cell formed using the method of claim 17.

31. A method of forming a memory cell, the method comprising:
    forming a layer of a carbon nanotube ("CNT") material above a substrate;
    forming a protective liner over the CNT material;
    forming an electrode over the protective liner;
    using a non-oxygen based chemistry to etch the electrode, the protective liner and the CNT material in a single etch step at a substrate bias power of between about 50 and about 150 Watts to have nearly vertical sidewalls and little or no undercut of the CNT material;
    forming a dielectric sidewall liner on sidewalls of the etched CNT material; and
    forming a steering element coupled to the etched CNT material.

32. The method of claim 31, wherein the steering element comprises a diode.

33. The method of claim 32, wherein forming the steering element comprises:
    forming one or more layers of silicon above the substrate; and
    etching the one or more layers of silicon.

34. The method of claim 33, comprising etching the one or more layers of silicon and the CNT layer in a single etching step.

35. The method of claim 33, comprising etching the one or more layers of silicon and the CNT layer separately.

36. A memory cell formed using the method of claim 31.

* * * * *